US009117835B2

(12) United States Patent
Ammar

(10) Patent No.: US 9,117,835 B2
(45) Date of Patent: Aug. 25, 2015

(54) HIGHLY INTEGRATED MINIATURE RADIO FREQUENCY MODULE

(75) Inventor: Danny F Ammar, Windermere, FL (US)

(73) Assignee: Stalix LLC, Orlando, FL (US)

( * ) Notice: Subject to any disclaimer, the term of this patent is extended or adjusted under 35 U.S.C. 154(b) by 505 days.

(21) Appl. No.: 12/550,875

(22) Filed: Aug. 31, 2009

(65) Prior Publication Data

US 2011/0051375 A1 Mar. 3, 2011

(51) Int. Cl.
*H05K 7/00* (2006.01)
*H01L 23/66* (2006.01)
*H01L 23/552* (2006.01)
*H01L 25/16* (2006.01)

(52) U.S. Cl.
CPC .............. *H01L 23/66* (2013.01); *H01L 23/552* (2013.01); *H01L 25/16* (2013.01); *H01L 2223/6627* (2013.01); *H01L 2924/0002* (2013.01); *H01L 2924/09701* (2013.01); *H01L 2924/19032* (2013.01); *H01L 2924/19051* (2013.01); *H01L 2924/3011* (2013.01); *Y10T 29/49117* (2015.01)

(58) Field of Classification Search
USPC .................................................. 361/729, 728
See application file for complete search history.

(56) References Cited

U.S. PATENT DOCUMENTS

| 5,745,017 A * | 4/1998 | Ralph ............................ 333/116 |
| 7,907,030 B2 * | 3/2011 | Vaughn et al. ................. 333/1.1 |
| 2002/0049042 A1 * | 4/2002 | Oida et al. ....................... 455/90 |
| 2007/0080360 A1 * | 4/2007 | Mirsky et al. ................... 257/99 |

* cited by examiner

*Primary Examiner* — Andargie M Aychillhum

(57) ABSTRACT

A highly integrated miniature RF module includes a dielectric base board with opposing top and bottom metal layers and having interconnects traces, radio frequency (RF) circuits and semiconductor chips at the top metal layer and ground and signal pads at the bottom metal layer. Metalized vias extending through the dielectric material connect the top and bottom layers. A top cover made out of laminate material, such as FR-4, with opposing top and bottom metal layers and having machined compartments and channels, surrounded with arrays of metal plated vias extending through the laminate material, protects the RF circuits and chips and provide the required isolation and wave propagation.

7 Claims, 6 Drawing Sheets

TOP VIEW

BOTTOM VIEW

HIGHLY INTEGRATED MINIATURE RADIO FREQUENCY MODULE

FIELD OF THE INVENTION

This invention relates to Radio Frequency (RF) modules used, for example, in sensors, communication devices or weapon systems, and, more particularly, to a highly integrated, high frequency miniature module that employs a base board with etched traces and RF circuits, a number of semiconductor chips and a channelized cover made of low cost laminate material.

BACKGROUND OF THE INVENTION

Multi-chip RF modules, such as transceivers, frequency multipliers, up-converters and down converters, have been designed and built for decades. The most common method used by manufacturers of multi-chip RF modules, is to assemble the chips and RF components in a machined metal housing with expensive waveguide or coaxial interfaces. A Typical high frequency module consists of a number of Microwave Monolithic Integrated Circuit (MMIC) chips, substrates with matched impedance lines and filters, and passive components, all mounted with epoxy or solder to a machined housing. The chips and substrates components are typically connected to other each other via wire or ribbon bonds. Tuning of the radio frequency modules after assembly is almost always necessary.

High frequency modules typically require special RF board material or substrate with stable dielectric characteristics and tight manufacturing tolerances because of the inherent shorter wavelength. They also require intricate housing enclosures with channelization for wave propagation and isolated compartments to avoid interference and prevent oscillations. These housings are typically made of expensive coefficient of thermal expansion (CTE) matched material to prevent damage to the semi-conductor chips during temperature cycles.

The miniature RF module of the current invention is highly integrated, uses no metal housings, has a small foot print, provides high level of isolation between the different circuits, and costs a fraction of prior art multi-chip modules. The miniature RF module simply consists of a base board, a number of semiconductor chips and a cover made of laminate material. The base board provides 3 main functions: 1) acts as a carrier for the chips, 2) provides all the necessary matched impedance lines and filters (etched on it), and 3) provides an interface for easy mounting of the miniature module using surface mount technology (SMT). The semi conductor chips used in the miniature module can be SMT type (packaged dies) or MMIC bare dies. The cover is made of machined printed circuit board (PCB) material, such as FR-4. FR-4, which is an abbreviation for Flame Retardant 4, is a laminate consisting of a continuous filament glass cloth material with an epoxy resin binder. Although different types of PCB materials may be used, FR-4 is preferred due to several mechanical and electrical properties; including high insulation, high physical strength and stiffness, low weight, low moisture absorbance, flame resistance, low cost, and worldwide availability.

SUMMARY OF THE INVENTION

This invention is directed to a miniature multi-chip RF module that provides high level of integration, improves circuit performance, and reduces the overall foot print and cost of RF modules. It is therefore an object of the present invention to provide a miniature RF module that overcomes the disadvantages of prior art multi-function modules.

One aspect of this invention is predicated on the concept of providing a simple, highly integrated miniature module comprising multiple chips and RF circuits arranged in a highly compartmentalized, easily assembled, and lower in cost SMT package. In one embodiment, the miniature module includes a base board formed from a dielectric material and opposing top and bottom metal layers. The top metal layer has radio frequency (RF) circuits and the bottom metal layer has ground and signal pads. Semiconductor chips are mounted to the base board using epoxy or solder and are operative with the RF etched circuits and signal pads for receiving external RF and DC signals and sending RF Signals. A top cover made of machined laminate materials, such as FR-4, with opposing top and bottom metal layers and arrays of metal plated vias extending through the laminate material and connecting the two metal layers, is positioned over the base board to protect the semiconductor chips and RF circuit and provide isolation walls and waveguide channels.

In an alternate aspect of the present invention, the base board can be formed of soft dielectric material such as PTFE with opposing copper clad layers or hard substrate material, such as ceramic, with opposing metal plated surfaces. Heat transfer vias and interconnect vias could be formed within the base board. The metal plated vias extend through the base board and connect the top and bottom ground layers. Other metal plated vias can extend from a top metal layer to bottom signal pads for carrying input and output signals. A bottom metal layer of the base board can be configured for surface mounting on an external board or carrier, wherein the external board or carrier include signal terminals operative with the chips and RF circuits inside the miniature module.

In accordance with one aspect of the present invention, the miniature module of the present invention includes a base board, semiconductor chips and RF circuit components. These chips and components are operatively connected to each other through appropriate matched impedance lines etched on top of the base board.

In one aspect of the present invention, filters can be etched on the top surface of base board and be operatively connected to the at least one chip. The filter includes a plurality of coupled line resonators formed as stripline or microstrip.

In yet another aspect of the present invention, the top cover is made of laminate material, such as FR-4, that is machined to form channels and compartments to provide isolation between RF circuits and chips. An array of metal plated vias, aligning the walls of the channels and compartments and extending through the laminate material and connecting the top and bottom metal layers, forms waveguide channels and isolated compartments.

The present invention advantageously overcomes the prior art drawbacks and provides an SMT miniature module and method of fabricating same by using a low cost materials to create a miniature RF module that is surface mounted on a external circuit board or carrier of the type known to those skilled in the art.

BRIEF DESCRIPTION OF THE DRAWINGS

Other objects, features and advantages of the present invention will become apparent from the detailed description of the invention which follows, when considered in light of the accompanying drawings in which.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
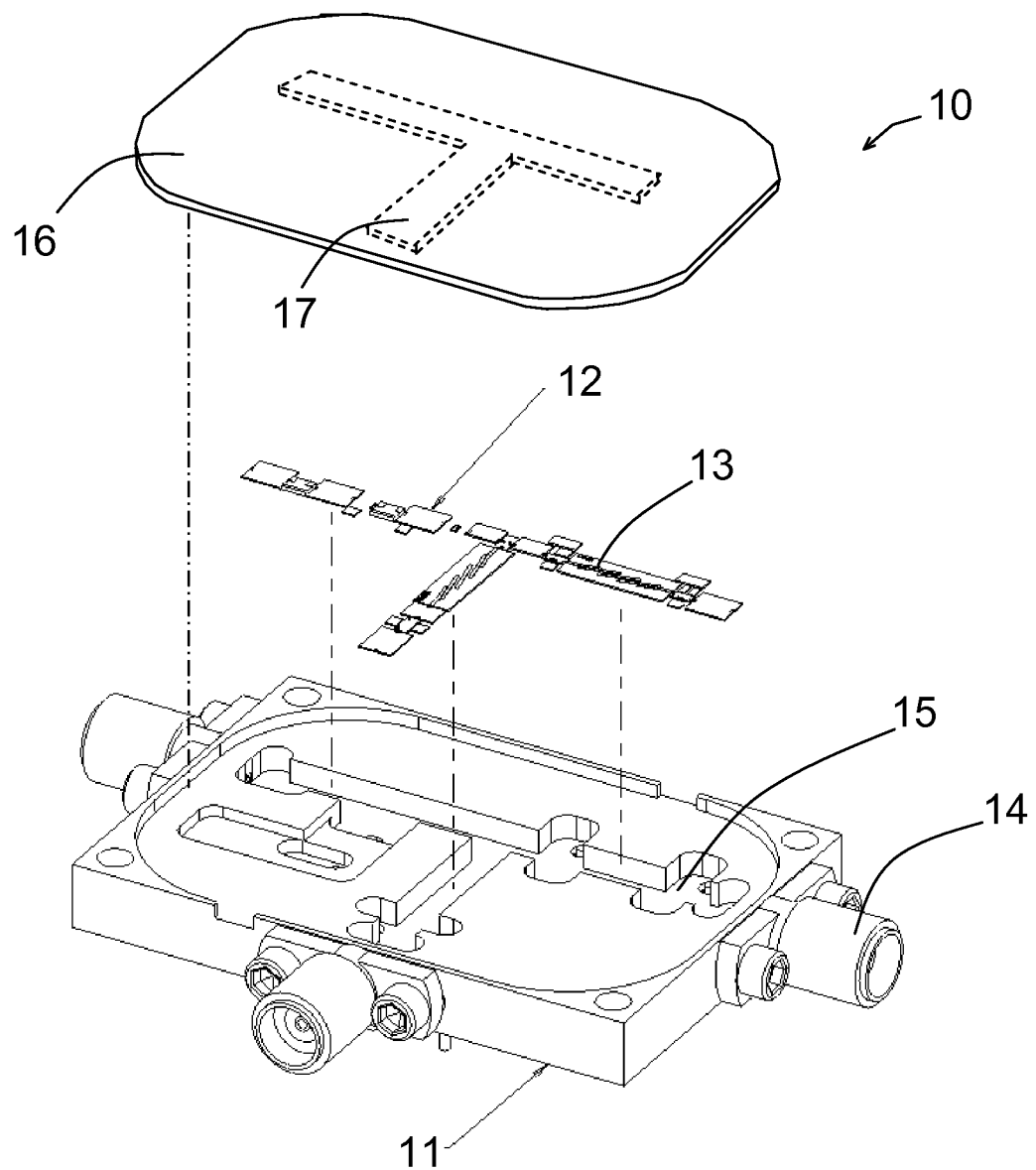
FIG. 1 is a prospective view of prior art RF module.
Figure 2:
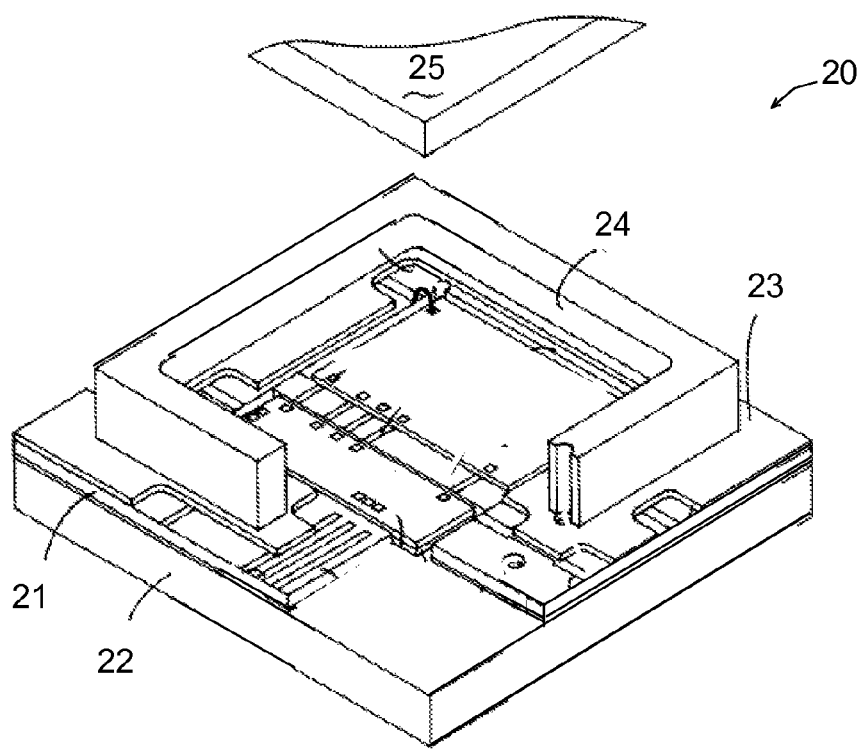
FIG. 2 is a prospective view of prior art RF component packaging
Figure 3:
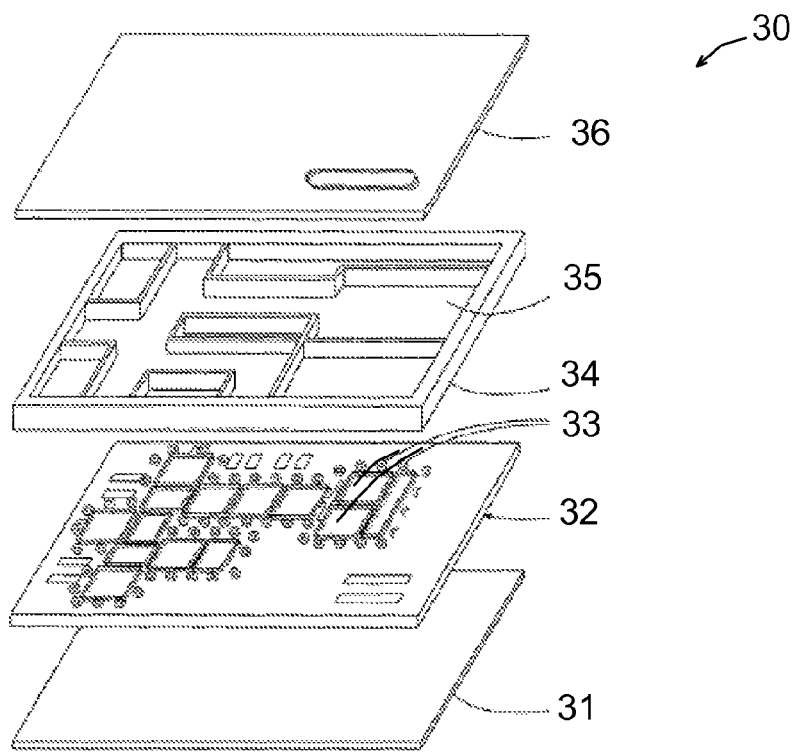
FIG. 3 shows a prior art multi-function RF module

FIG. 1 illustrates a prior art multi-chip module 10, such as used for high frequency RF transceiver or similar devices, with a housing 11 formed of a CTE matched material, such as copper tungsten (CuW) or aluminum silicon carbide (AlSiC), and used to mount semi-conductor microwave monolithic integrated circuit MMIC die or chips 12 with associated substrates 13 used as interconnects and coupled resonators filters. The housing 11 also includes expensive coaxial or other cable connectors 14 and machined channels 15 for receiving chips and substrates, as illustrated. The coefficient of thermal expansion for the housing material and substrate/MMIC chip is closely matched. In this type of design, the CTE matching is necessary to prevent the semiconductor chips, dies and associated interconnect substrates, from cracking as the housing material shrinks and expands during temperature fluctuations. Naturally, the CTE-matched housing material is expensive and difficult to form. Following assembly of the chips and substrate in the channels, a module cover 16 is used to enclose the circuits. Radio Frequency RF absorber material 17, which is bonded to the underside of the cover and lined up with the channels, is used to dampen any oscillations.

Two additional prior art RF packages will now be discussed to further highlight differences with the current invention. First, a MMIC chip package, described in Chan's patent (U.S. Pat. No. 5,451,818), is illustrated in FIG. 1A. This millimeter wave device package 20 comprises a dielectric substrate 21 disposed upon a supporting metal base 22 such that the substrate extends substantially along the peripheral edge of the base, defining a central aperture. A solid conductive layer 23 substantially covers the first surface of the dielectric substrate 21 and a series of conductive transmission lines are formed on an opposing second surface of the substrate. A seal metal ring 24 is disposed upon and the conductive layer 23. A lid 25 is sealed atop the seal ring completes the hermetical seal for the device. It should be noted that Chan design still represents a classical method of a MMIC device packaging, which uses expensive CTE matched metal plates and housings. Also, Chan's patent does not address multi-chip RF circuit interference issues and the need for isolation and filtering.

The second prior art RF package, described in Ammar's patent (U.S. Pat. No. 7,005,740) is illustrated in FIG. 1B. A thick film millimeter wave transceiver module 30 includes a metal base plate 31 and a multi-layer substrate board 32 having a plurality of layers of low temperature transfer tape received on the base plate. The layers can include a DC signals layer having signal tracks in connection; a ground layer having ground connections; a device layer having capacitors and resistors embedded therein; and a top layer having cut-outs for receiving MMIC chips 33 therein. A metal channelization plate 34 is received over the multi-layer substrate board 32 and channels 35 are formed to receive MMIC chips and provide isolation between transmit and receive signals. A metal lid 36 is installed over the channelized plate 34. The RF module described here still uses metal plates and expensive CTE matched housings and does not deviate substantially from typical connecterized multi-chip RF module design and fabrication.

The present invention does not use any metal housing or expensive connectors and substrates. It is directed to a low cost, miniature multi-chip module formed as a single Surface Mount Technology (SMT) package, allowing at least a 100:1 reduction in size and weight as compared to prior art RF modules that were similar in function. The miniature module of the present invention uses a low cost RF soft board or hard substrate as a base carrier for semiconductor chips, and provides the necessary interconnect traces and coupled-resonator filters. The miniature module cover, which is made of machined low cost laminate material such as FR-4, protects the chips, provides compartments for circuit isolation, and creates propagation waveguide channels. The base board and the chip cover when assembled form a Surface Mount Technology (SMT) miniature RF module that mounts directly to a larger external board or carrier. This miniature SMT module simplifies manufacturing by incorporating all functions into a single miniature package.

Figure 4:
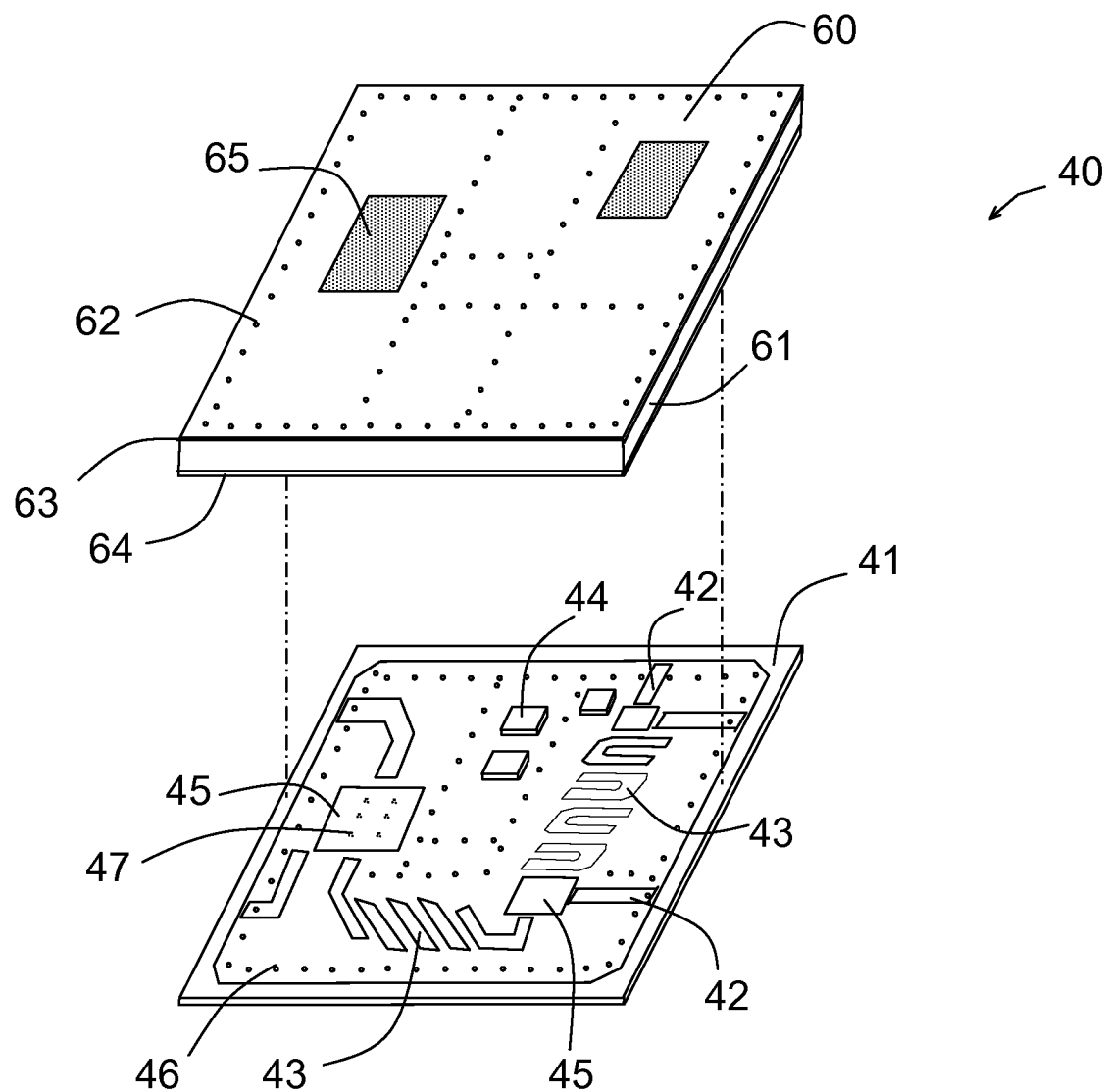
FIG. 4 is a prospective view of the miniature module in accordance with the present invention.

Referring now to FIGS. 4-7, one embodiment of a miniature module according to this invention is illustrated which may comprise a base board 41 and a cover 60 as discussed below with reference to FIG. 4. The miniature module 40 is initially generally described, followed by a discussion of individual aspects of the design.

The miniature module 40, as depicted in FIG. 4, includes a base board 41, and a cover 60. The base board 41, formed of dielectric material with opposing metal layers, typically will have various interconnect traces 42 and coupled resonator filters 43 that are etched with stripline or microstrip lines, as illustrated. The base board 41 also acts as a carrier for semiconductor SMT chips 44 and MMIC bare dies 45. Arrays of metal plated vias 46, extending through the dielectric material are used for interconnecting the layers and connecting RF component and circuits to signal pads for carrying input and output signals. Heat sink metal plated vias 47 transfer heat from the chips to the bottom of the base board, as illustrated. The cover 60 is typically made of laminate material 61 such, as FR-4 board, with machined cavities (not shown) lined-up with arrays of metal plated vias 62 that extend through the laminate material 61 and connect the top metal layer 63 and bottom metal layer 64. Selective areas 65 (typically above active amplifiers) of the top metal layer 63 are etched away. The effect of this selective metal layer removal is to provide dampening and to eliminate the need for RF absorber material. The characteristics of the vias 62, which connect the top and bottom metal layers and create isolated channels within the cover, will be discussed in more details later. The miniature module 40 is assembled by installing the channelized laminate cover 60 over the base board 41, containing chips and RF components, using epoxy or solder.

Figure 5:
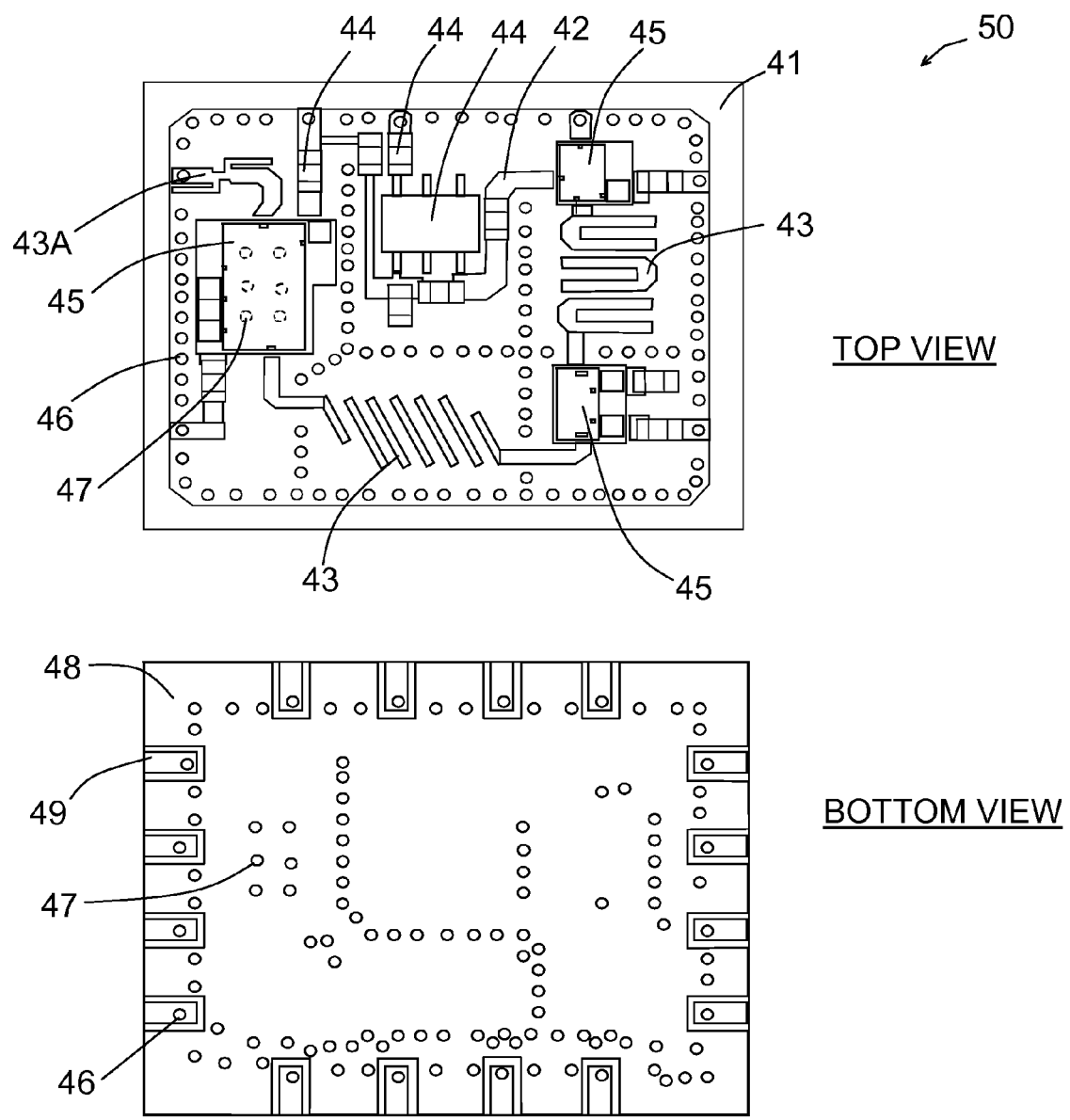
FIG. 5 shows a top and bottom views of the base board in accordance with the current invention.

FIG. 5 shows top and bottom views of the base board 41 of the miniature module of the current invention. The base board 41 can be formed from a soft board laminate, such as glass reinforced PTFE composite or hard substrate material such as glass or Alumina. It is essential that the base board has low electrical losses and uniform dielectric properties over the operating frequencies of the miniature module. PTFE type board is usually supplied as a laminate with the top and bottom metal layers formed and clad with rolled copper foil. Hard substrate type base board can be processed, using thin film or thick film techniques, to add metal layers using screen-printing or sputtering. Dependent on the particular application, the base board can have a standard thickness between 0.005 and 0.040 inches.

The matched impedance lines 42 and coupled resonator filters 43 and matching networks 43A can be formed by etching or printing techniques. The semiconductor chips 44 can be assembled to the base board using standard SMT techniques. The bare MMIC dies 45 are typically bonded to the base board using epoxy or solder and are connected to the RF traces through wire or ribbon bonds. The base board 41 has a number of vias 46 that provide isolation and transfer signals between the layers. Similar type metal plated vias 47 are placed under the chips to transfer heat from the chips to the bottom layer where heat will be dissipated. The bottom of the base board is generally covered by a ground metal layer 48 except for the mounting pads 49, which are connect to the top traces 42 with metal plated vias 46. The bottom metal layer is etched to create the input and output ports 49. These ports 49 and planar configuration allow this miniature module 40 to be mounted to another external board or carrier using normal SMT processes. Input and output signals are carried from the top layer to the bottom leads using vias 46. High frequency signal transfers between the layers require special design consideration and matching networks to minimize losses. Also, a large number of vias are used to connect the top ground to the bottom RF ground formed by the metal layers.

Figure 6:
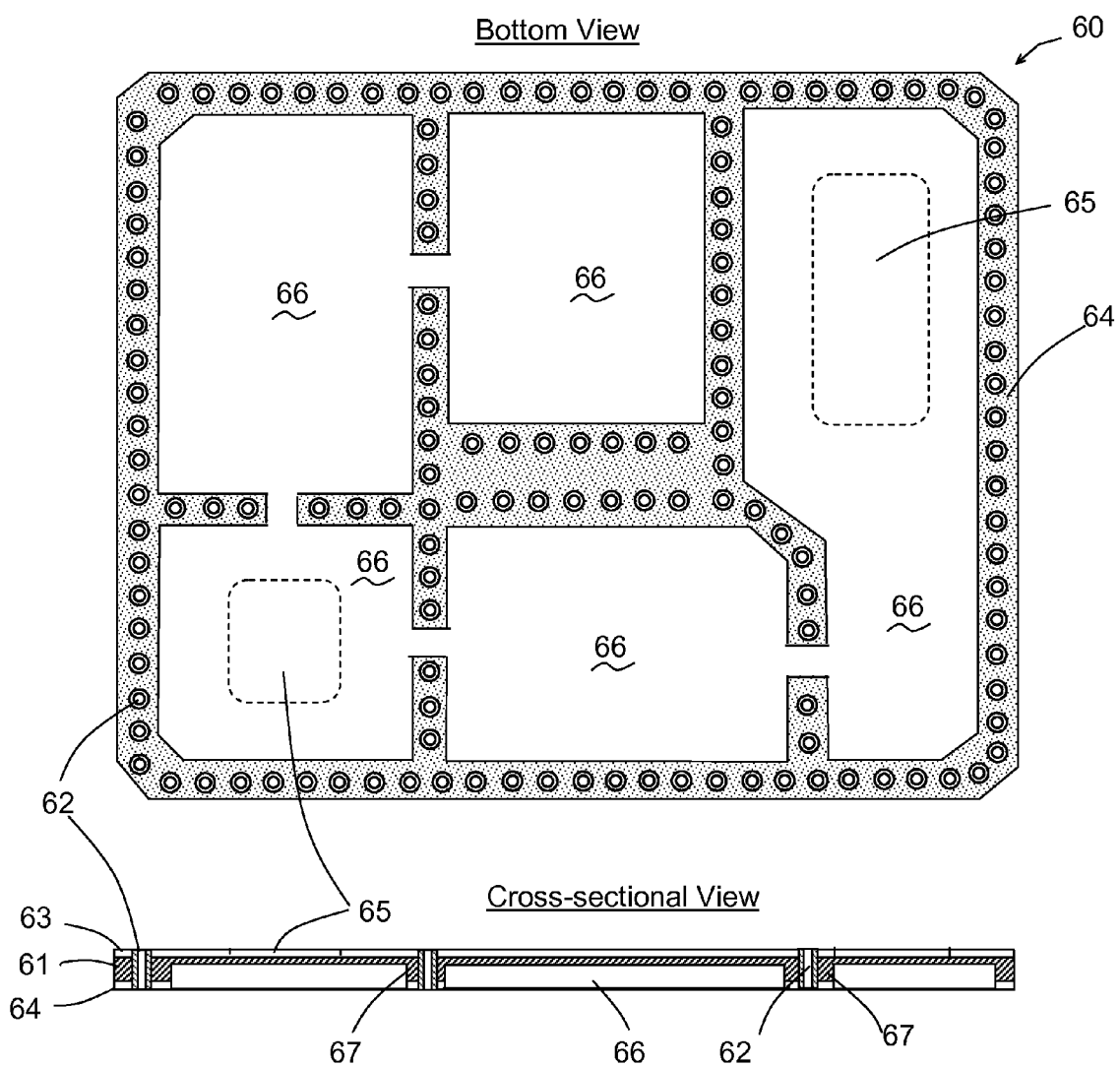
FIG. 6 shows bottom plan view and a cross sectional view of the current invention's cover.

FIG. 6 shows a bottom view and a cross-sectional view of the top cover 60 for the miniature module of the current invention. The cover 60 can be made from low cost laminate board such as FR-4 with a top metal layer 63 and bottom metal layer 64. This type of board is usually supplied as a laminate with the top and bottom metal layers formed and clad with rolled copper foil. A one to two ounce copper layer forming the respective top and bottom metal layers 63 and 64 has been found adequate. The cover 60 is dimensioned to fit over the base board 41 shown by the similar outline configuration of FIGS. 4 and 5. The compartments and channels 66 are formed by machining the FR-4 material to a specified depth. The compartment and channel walls 67 are lined-up with metal plated vias 62 extending from the top metal layer 63 to the bottom metal layer 64. The size and shape of the compartments and channels 66 are carefully controlled by RF design guidelines to insure proper propagation of RF energy and cut off of unwanted signals. The spacing between the vias 62, which is typically ¼ of a wavelength of the highest frequency used in the miniature module, is critical to insure isolation between the different compartments. Selective areas 65 on the top metal layer 63 are etched to eliminate the need for using of absorber material above active devices, such as amplifiers. It has been discovered that the FR-4 material, when controlled to a given thickness, provides excellent RF absorption characteristics even at very high frequencies.

The unique design characteristics of the base board 41 with its etched RF circuits and interconnects and cover 60 with its special material, compartments and channels, metalized vias size and spacing, and selective surface etching, are important in the performance of the miniature RF module 40. The discussion that follows concerns this aspect of the present invention.

There are many utility and simulation programs available in the market that allow some one to design microstrip, strip line, coplanar circuits, matching networks and printed filters for a given frequency, impedance and substrate dimensions. Although impedance matching networks may seem mundane, their proper design and implementation is critical to the efficient transfer of power along the signal path of an RF device. If there is an impedance mismatch, electrical signals will undergo reflections at the boundary of the impedance discontinuity, which can cause a significant power loss. Miniaturized RF modules designs such as the miniature module of this invention present special challenges. Three dimensional models using Electromagnetic simulators, such as HFSS sold by Ansof Corporation, are critical for high frequency module design.

The miniaturization of filters, which are the core components in many RF modules, is a very important element in this invention. Planar transmission line filters are advantageous because of their planar circuit and their simplicity of fabrication, as well as their lower cost. Among planar transmission line filters, the ladder filters based on periodic structures, the pseudo-inter-digital and hairpin filters using bent resonators, and the comb-line filters with lumped components, are a few examples. This invention's miniature filter designs rely on the fact that any transmission line within a specified accuracy range can be miniaturized into a transmission line having higher characteristic impedance by using shunt capacitors. A parallel coupled-line can be considered as a linear superposition of even- and odd-mode equivalent circuits, and can be miniaturized.

The miniaturization methods used by this invention for matching networks and parallel coupled-line filters dramatically reduce the size of the RF module. In addition to the size reduction, excellent suppression of spurious harmonic responses, which are inherent in this type of modules, is achieved with improved performance characteristics.

The selection of the material for the miniature RF module cover is driven by many factors including cost, availability and most important performance. FR-4 boards are widely used for electronic circuits and low frequency modules. They have not been used for high frequency circuits because of their high signal propagation losses and high dielectric material variability. However, what has been discovered in the current invention is this material ability to absorb high frequency signals and act as an RF absorber. This material is not being used in this invention as an RF board, but instead as an RF cover/absorber to replace expensive CTE matched housings.

A waveguide channel shape is defined by the frequency and the desired propagation modes. Metal waveguides (channels) have been commonly used in RF application to propagate the desired RF signals while preventing (cutting off) unwanted signals. The size and shape of the waveguide channel defines the operating frequency and the cut-off frequency. The current invention channelized cover 60 is not made of metal material. The channels and waveguides in the cover are created by using walls of vias in the dielectric material. In order for the RF energy to propagate and stay within the channel, the vias spacing must be approximately ¼ of a wavelength. The vias should all be connected to an RF ground to act as a well. The diameter of the vias should be sufficiently small to support tight spacing and be easily implemented by normal PCB board processing techniques. The width and height of the machined channels are carefully selected based on the operating frequency of the circuits.

The miniature module cover 60 fabrication starts with a standard laminate board, such as FR-4, with 2 opposing metal clad layers. First, the vias are installed in the material to define the desired channels and compartments. Next the bottom layer is etched to define the location of the machined areas. The top metal layer is selectively etched in areas above active RF components such as amplifiers. Selectively etching the top metal layer has been shown to improve the active RF components stability and reduce oscillation. This is one of the key characteristics of the current invention. The last step in the fabrication of the cover 60 is the machining step. The depth of the channels is controlled to insure proper spacing for the RF components on the base board 41, and adequate channel height for signal propagation. The thickness of the remaining dielectric material after machining is properly controlled to ensure adequate dampening and absorption of stray RF signals.

Although the cover 60 of the present invention (FIG. 6) is made of laminate board, it must still adhere to critical properties of RF module design and perform the same function as a metal housing, but with a much more efficiency, less cost and smaller size than taught in the prior art.

Although RF waveguides can support many modes of transmission, the usual mode of transmission in rectangular waveguide is called TE01. The lower cutoff wavelength (and frequency) for this mode are:

$$\lambda_{lower\ cut\ off} = 2 \times a\ (m)$$

$$F_{lower\ cut\ off} = c/(2 \times a)\ (GHz)$$

Where a=dimension of the broad wall (meters)
c=Speed of light (meters/second)

The upper cutoff frequency is exactly one octave above the lower. The accepted limits of operation for rectangular waveguide are (approximately) between 125% and 189% of the lower cutoff frequency.

Although waveguide channels in prior art RF modules are typically created by machining metal housings, this inventions waveguide channels are created by a combination of laminate material, top metal layer and walls of metal plated vias.

In one presently preferred embodiment, the integrated miniature module measures approximately 15 mm×15 mm×2 mm and weighs <1 gram in one non-limiting example of a 30 GHz transmitter. This represents over 100:1 reductions in size and weight when compared to an equivalent prior art transmitter. The miniature module is uniquely designed to provide high performance and low cost. The exact design of the RF circuits and channelized cover are derived from the fundamental RF design rules for high frequency modules which in this instance is 30 GHz.

Figure 7:
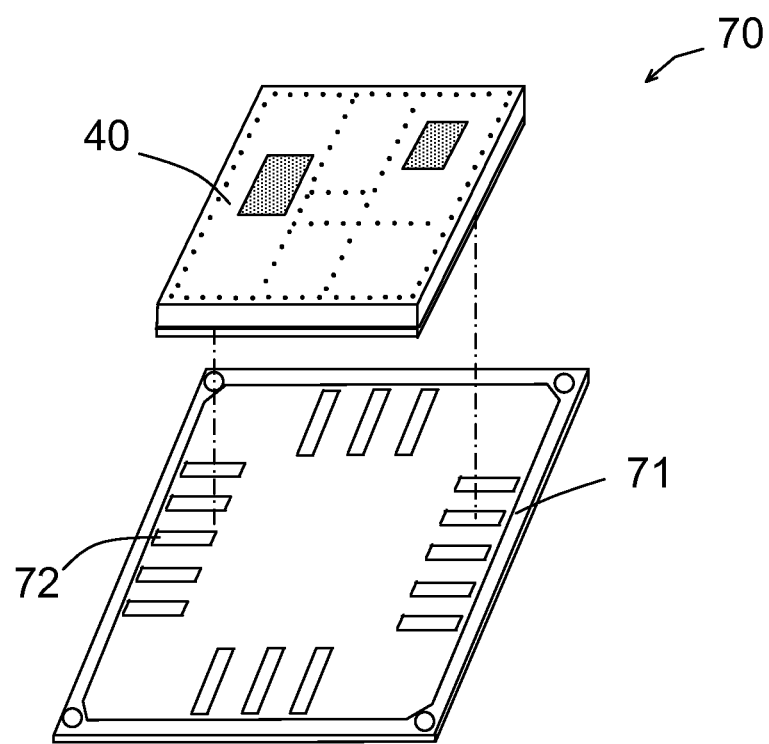
FIG. 7 shows a prospective view of an exemplary interface of the miniature module of the current invention with an external PCB board or carrier.

FIG. 7 shows a method of mounting the miniature RF module 40 of the current invention to an external board or carrier 71. The planar configuration of the miniature module 40 allows it to be mounted to another board using normal SMT processes. Input and output signals are carried from the external board or carrier 71 to the miniature module 40 through the mounting pads 72.

A miniature module, whether receiver, transmitter, transceiver, frequency multiplier or other RF functions can be formed in accordance with the present invention using various techniques known to those skilled in the art. Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the claims.

What is claimed is:

1. A miniature RF module comprising: a base board formed from a single layer of dielectric material and opposing top and bottom metal layers, said top metal layer having etched interconnect lines and Radio Frequency (RF) circuits and said bottom metal layer having ground and signal pads; a number of packaged or bare die semiconductor chips mounted on said base board and that are operatively connected with said etched lines and RF circuits, and signal pads for receiving and outputting signals; a top cover formed of machined laminate material with apposing top and bottom metal layers is positioned over said base board for protecting said chips and bare die and providing required isolation and channelization; which said top cover comprises inside machined cavities and channels, lined-up with metal plated vias extending through the laminate material and connecting said top and bottom metal layers.

2. A miniature RF module cover comprising: a laminate material and opposing top and bottom metal layers; a number of machined compartments and channels in said laminate material; a number of metal plated vias extending through said laminate material and connecting said top and bottom metal layers and forming walls around said machined compartments and channels; metal plated vias connecting the top and bottom metal layers and extending through said laminate material and aligning the walls of the said machined compartments and channels; machined laminate material said metal plated vias and said top metal layer form waveguide channels for RF signal propagation.

3. A miniature RF module cover according to claim 2 in which said laminate material is easily machined, dimensionally stable, and has high strength and low moisture absorption.

4. A miniature RF module cover according to claim 2 in which said laminate has top and bottom metal layers formed of copper clad foil which can be etched by standard PCB processing technology.

5. A miniature RF module cover according to claim 2 in which said laminate has a nominal thickness between 0.020 and 0.25 inches.

6. A miniature RF module cover according to claim 2 in which said laminate is machined to specific depths and widths to create said compartments and channels by removing material.

7. A miniature RF module cover according to claim 2 in which said laminate material is acting as an RF absorber to prevent RF circuit oscillations.

* * * * *